United States Patent
Kwak et al.

(10) Patent No.: US 8,059,464 B2
(45) Date of Patent: Nov. 15, 2011

(54) NONVOLATILE MEMORY DEVICE, METHODS OF PROGRAMMING THE NONVOLATILE MEMORY DEVICE AND MEMORY SYSTEM INCLUDING THE SAME

(75) Inventors: Donghun Kwak, Hwaseong-si (KR); Youngho Lim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 170 days.

(21) Appl. No.: 12/551,268

(22) Filed: Sep. 1, 2009

(65) Prior Publication Data
US 2010/0103740 A1 Apr. 29, 2010

(30) Foreign Application Priority Data
Oct. 24, 2008 (KR) .................. 10-2008-0104823

(51) Int. Cl.
*G11C 16/04* (2006.01)
(52) U.S. Cl. .............. 365/185.18; 365/236; 365/185.09; 365/185.03
(58) Field of Classification Search ............. 365/185.18, 365/236, 185.09, 185.03, 189.07
See application file for complete search history.

(56) References Cited

U.S. PATENT DOCUMENTS

| | | | | |
|---|---|---|---|---|
| 5,777,923 A | * | 7/1998 | Lee et al. .................. | 365/185.11 |
| 7,522,454 B2 | * | 4/2009 | Li et al. .................... | 365/185.18 |
| 7,916,536 B2 | * | 3/2011 | Roohparvar et al. .... | 365/185.03 |

FOREIGN PATENT DOCUMENTS

| | | |
|---|---|---|
| JP | 2006-155735 | 6/2006 |
| KR | 1020010001529 | 1/2001 |
| KR | 10-0816220 | 3/2008 |

OTHER PUBLICATIONS

English Abstract for Publication No. 1020010001529.
English Abstract for Publication No. 2006-155735.
English Abstract for Publication No. 10-0816220.

* cited by examiner

*Primary Examiner* — David Lam
(74) *Attorney, Agent, or Firm* — F. Chau & Associates, LLC (57) ABSTRACT

A nonvolatile memory device is provided. A counter counts an amount of data to be program-inhibited among data to be written to memory cells to provide a first count value. The counter also counts an amount of program-inhibited data among data written to the memory cells to provide a second count value. Control logic controls a program operation by comparing the first count value with the second count value.

16 Claims, 7 Drawing Sheets

NONVOLATILE MEMORY DEVICE, METHODS OF PROGRAMMING THE NONVOLATILE MEMORY DEVICE AND MEMORY SYSTEM INCLUDING THE SAME

CROSS-REFERENCE TO RELATED APPLICATION

This application claims priority to and the benefit of Korean Patent Application No. 2008-104823, filed on Oct. 24, 2008, the entire content of which is incorporated by reference herein.

BACKGROUND

The present disclosure relates to semiconductor memory devices, and, more particularly, to nonvolatile memory devices.

Semiconductor memory devices are memory devices that can store data and read stored data when necessary. Semiconductor memory devices are typically classified into volatile memory devices and nonvolatile memory devices.

Volatile memory devices lose their stored data when a power supply is interrupted. Volatile memory devices include static random access memory (SRAM), dynamic random access memory (DRAM) and synchronous dynamic random access memory (SDRAM). Nonvolatile memory devices retain their stored data even when a power supply is interrupted. Nonvolatile memory devices include read only memory (ROM), programmable read only memory (PROM), erasable programmable read only memory (EPROM), electrically eraseable programmable random access memory (EEPROM), flash memory devices, phase-change random access memory (PRAM), magnetoresistive random access memory (MRAM) and ferroelectric random access memory (FRAM). Flash memory devices may be classified into a NOR-type and a NAND-type.

SUMMARY

In accordance with an exemplary embodiment of the present invention a nonvolatile memory device is provided. A counter counts an amount of data to be program-inhibited among data to be written to memory cells to provide a first count value. The counter also counts an amount of program-inhibited data among data written to the memory cells to provide a second count value. Control logic controls a program operation by comparing the first count value with the second count value.

The control logic may set a program pass that indicates that the program operation has executed properly when the first count value and the second count value are the same.

The control logic may set a program fail that indicates that the program operation has not executed properly when the first count value and the second count value are different.

The control logic may override the program fail and set a program pass that indicates that the program operation has executed properly when a difference between the first count value and the second count value are within a range correctable by an error correction code.

The control logic may detect programmed data among data to be program-inhibited by comparing the first count value with the second count value.

The control logic may detect a program disturbance of the memory cells into which data to be program-inhibited are written by comparing the first count value with the second count value.

The program disturbance may result from channel coupling of channel voltages between adjacent bit lines.

In accordance with an exemplary embodiment of the present invention a method of programming a nonvolatile memory device is provided. Data to be program-inhibited among data to be written to memory cells is counted to provide a first count value. The data is written. Program-inhibited data among data written to the memory cells is counted to provide a second count value. A program operation is controlled by comparing the first count value and the second count value.

If the first count value and the second count value are the same, the program operation may be deemed to have executed properly.

In accordance with an exemplary embodiment of the present invention a memory system is provided. A nonvolatile memory device has memory cells. A controller controls the nonvolatile memory device. The nonvolatile memory device includes a counter that counts an amount data to be program-inhibited among data to be written to the memory cells to provide a first count value and that counts an amount of program-inhibited data among data written to the memory cells to provide a second count value, and control logic that controls a program operation by comparing the first count value with the second count value.

The nonvolatile memory device and the controller may constitute a solid state drive.

The nonvolatile memory device and the controller may constitute a memory card.

In accordance with an exemplary embodiment of the present invention, a method of programming a nonvolatile memory device is provided. First data to be program-inhibited among data to be written to memory cells is counted to provide a first count value. Second data to be program-inhibited among data to be written to memory cells is counted to provide a second count value. The first data and the second data are written to the memory cells. First program-inhibited data among data written to the memory cells is counted to provide a third count value. Second program-inhibited data among written data to the memory cells is counted to provide a fourth count value. A program operation is controlled by comparing the first count value with the third count value and comparing the second count value with the fourth count value.

If the first count value when compared with the third count value are the same and if the second count value when compared with the fourth count value are the same, the program operation may be deemed to have executed properly.

If the first count value when compared with the third count value are different, or if the second count value when compared with the fourth count value are different, the program operation may be deemed to have not executed properly.

The nonvolatile memory device may include memory cells having at least three logic states that include an erasure logic state, a first programmed state having a first threshold voltage and a second programmed state having a second threshold voltage higher than the first threshold voltage.

BRIEF DESCRIPTION OF THE DRAWINGS

The accompanying drawings, together with the description, illustrate exemplary embodiments of the present invention. In the drawings.

DETAILED DESCRIPTION OF THE EXEMPLARY EMBODIMENTS

Figure 1:
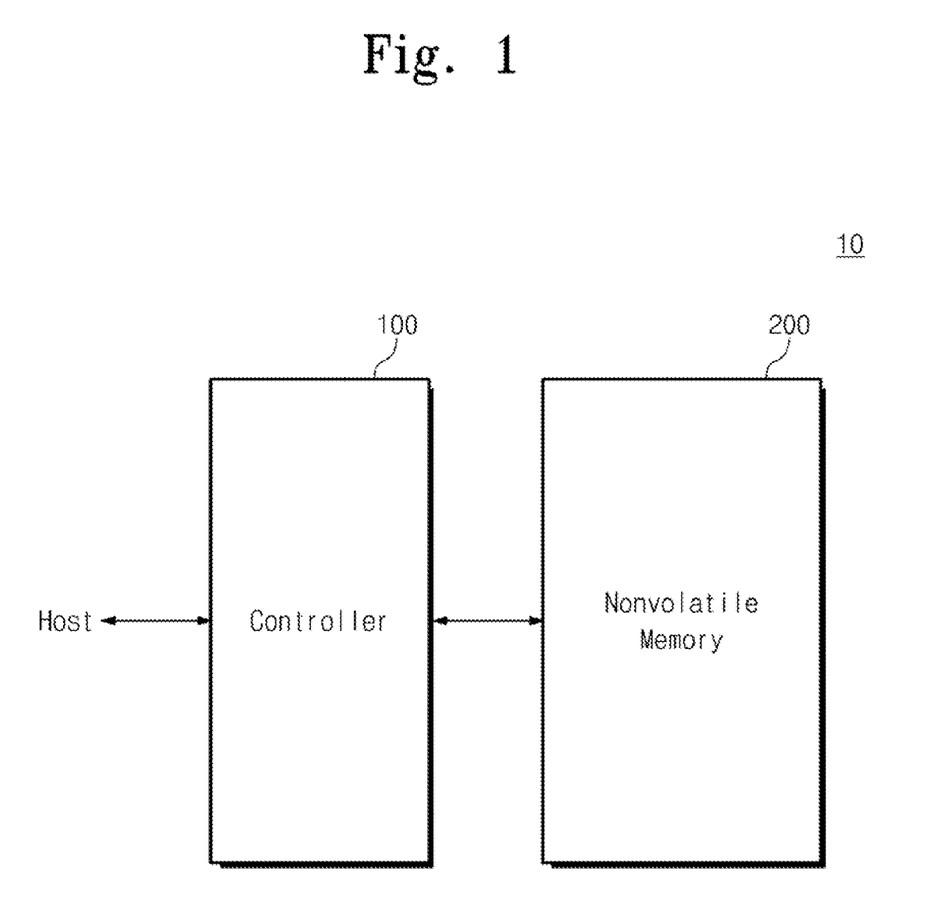
FIG. 1 is a block diagram of a memory system in accordance with an exemplary embodiment of the present invention.

Referring to FIG. 1, a memory system 10 according to an exemplary embodiment of the present invention includes a nonvolatile memory device 200 and a controller 100.

The controller 100 is connected to a Host and the nonvolatile memory device 200. The controller 100 transmits data read from the nonvolatile memory device 200 and stores data transmitted from the Host in the nonvolatile memory device 200.

The controller 100 includes elements which are well known, such as a random access memory (RAM), a processing unit, a host interface and a memory interface. The RAM is used as an operating memory of the processing unit. The processing unit controls the operation of the controller 100. The host interface includes a protocol for executing data exchange between the Host and the controller 100. For example, the controller 100 communicates with the Host through one of various interface protocols such as universal serial bus (USB), multimedia command (MMC), peripheral component interconnect exchange (PCI-E), advanced technology attachment (ATA), serial-ATA, parallel-ATA, small computer system interface (SCSI), enhanced small disk interface (ESDI) and integrated drive electronics (IDE). The memory interface interfaces with the nonvolatile memory device 200. The controller can further include an error correction block. The error correction block detects errors of data read from the nonvolatile memory device 200 and corrects the errors using error correction code (ECC).

The nonvolatile memory device 200 includes a memory cell array for storing data, a read/write circuit for reading data from the memory cell array and writing data in the memory cell array, an address decoder that decodes addresses transmitted from the outside and transmits the addresses to the read/write circuit and control logic that controls the operation of the nonvolatile memory device 200. The nonvolatile memory device 200 will now be described in more detail referring to FIGS. 2 to 6.

The controller 100 and the nonvolatile memory device 200 can be integrated as one semiconductor device, for example, to constitute a memory card. The controller 100 and the nonvolatile memory device 200 can also be integrated as one semiconductor device to constitute a personal computer memory card international association (PCMCIA) card, a compact flash card (CF), a smart media card (SM/SMC), a memory stick, a multimedia card (including MMC, RS-MMC, MMCmicro), a secure digital (SD) card (including SD, miniSD, microSD) or a universal flash memory device (UFS), or the like.

In an exemplary embodiment the controller 100 and the nonvolatile memory device 200 can be integrated as one semiconductor device to constitute a solid state disc/drive (SSD). When the memory system 10 is used as an SSD, the operational speed of the Host connected to the memory system 10 can be significantly improved.

In an exemplary embodiment, the memory system 10 can be applied to a personal digital assistant (PDA), a portable computer, a web tablet, a mobile phone, a wireless phone, a digital music system or devices that can transmit data and receive data in a wireless environment.

Hereinafter, a exemplary embodiment of the present invention will be described in conjunction with a flash memory device. However, it will be understood that exemplary embodiments of the present invention are not limited to flash memory. For instance, exemplary embodiments can include other types of nonvolatile memory devices (e.g., ROM, PROM, EPROM, EEPROM, flash memory devices, PRAM, MRAM and FRAM) in which a program disturbance (e.g., the unintended programming of unselected memory cells connected to a selected word line) can occur during a program operation. Also, it will be understood that the exemplary embodiments of the present invention described herein can be modified and applied to the various types of nonvolatile memory devices.

Figure 2:
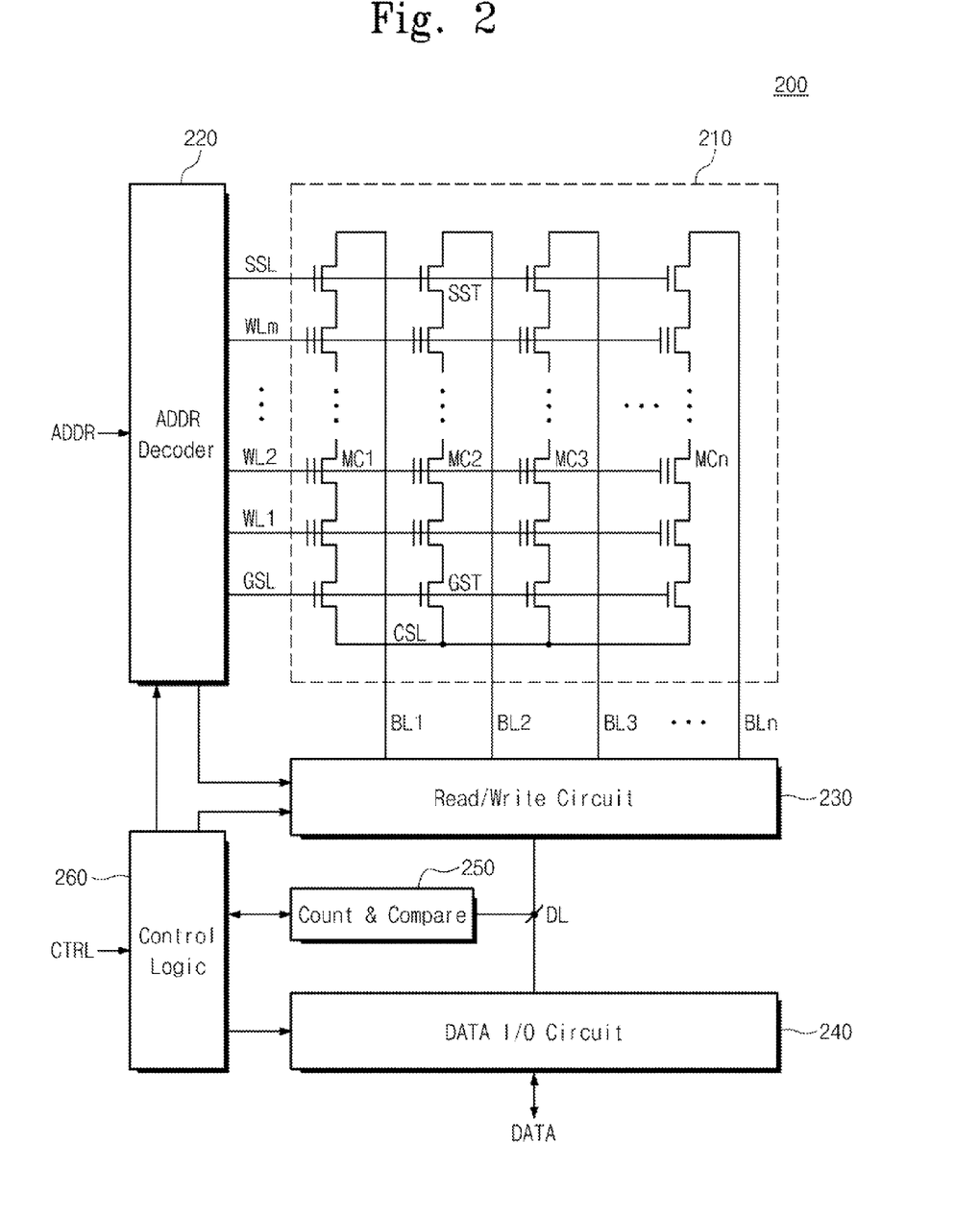
FIG. 2 is a block diagram of the nonvolatile memory device of FIG. 1.

FIG. 2 is a block diagram of an exemplary embodiment of the nonvolatile memory device 200 of FIG. 1. The nonvolatile memory device 200 is a flash memory device. The nonvolatile memory device 200 includes a memory cell array 210, an address decoder 220, a read/write circuit 230, a data input/output (I/O) circuit 240, a count/comparing circuit 250 and control logic 260.

The memory cell array 210 is connected to the address decoder 220 through word lines (WL1, WL2 ... WLm) and is connected to the read/write circuit 230 through bit lines (BL1, BL2, BL3 ... BLn). The memory cell array 210 includes a plurality of memory cells (MC). String selection transistors (SST) are connected between serially connected memory cells (MC) and bit lines (BL). Ground selection transistors (GST) are connected between serially connected memory cells (MC) and a common source line (CSL). The string selection transistors (SST) are connected to the address decoder 220 through a string selection line (SSL). The ground selection transistors (GST) are connected to the address decoder 220 through a ground selection line (GSL). The memory cells (MC) are connected to the address decoder 220 through the word lines (WL1, WL2 ... WLm). The memory cell array 210 can include a plurality of memory blocks. One memory block is depicted in FIG. 2 for convenience.

The address decoder 220 is connected to the memory cell array 210, the read/write circuit 230 and the control logic 260. The address decoder 220 operates in response to control signals from the control logic 260. The address decoder 220 receives addresses (ADDR) from the outside, for example, from the controller 100 of FIG. 1.

The address decoder 220 decodes a row address among the addresses to select the word lines (WL1, WL2 ... WLm). The address decoder 220 decodes a column address among the addresses to provide the decoded column address to the read/write circuit 230. The address decoder 220 includes elements which are well known such as a row decoder, a column decoder and an address buffer.

The read/write circuit 230 is connected to the memory cell array 210, the address decoder 220, the data I/O circuit 240, the count/comparing circuit 250 and the control logic 260. The read/write circuit 230 operates in response to the control logic 260. The read/write circuit 230 selects the bit lines (BL1, BL2, BL3 . . . BLn) in response to the decoded column address provided from the address decoder 220. The read/write circuit 230 writes the data transmitted from the data I/O circuit 240 through a data line (DL) into selected memory cells. The read/write circuit 230 also reads data stored in selected memory cells to transmit the data to the I/O circuit 240 through the data line (DL). The read/write circuit 230 includes elements which are well known, such as a column selection circuit, a page buffer, or the like. The read/write circuit 230 also includes elements which are also well known, such as a write driver, a detection amplifier, or the like.

The data I/O circuit 240 is connected to the read/write circuit 230, the count/comparing circuit 250 and the control logic 260. The data I/O circuit 240 operates in response to control signals from the control logic 260. The data I/O circuit 240 exchanges data (DATA) with the outside, for example, with the controller 100 of FIG. 1. The data I/O circuit 240 provides data (DATA) transmitted from the outside to the read/write circuit 230. The data I/O circuit 240 provides data (DATA) transmitted from the read/write circuit 230 to the outside. The data I/O circuit 240 also includes elements which are well known such as a data buffer, or the like.

The count/comparing circuit 250 is connected to the read/write circuit 230 and the data I/O circuit 240 through the data line (DL). The count/comparing circuit 250 operates in response to control signals from the control logic 260. The count/comparing circuit 250 is described in more detail referring to FIGS. 3 through 5.

The control logic 260 controls the operation of the nonvolatile memory device 200 in response to control signals (CTRL) from the outside, for example, from the controller 100 of FIG. 1.

Figure 3:
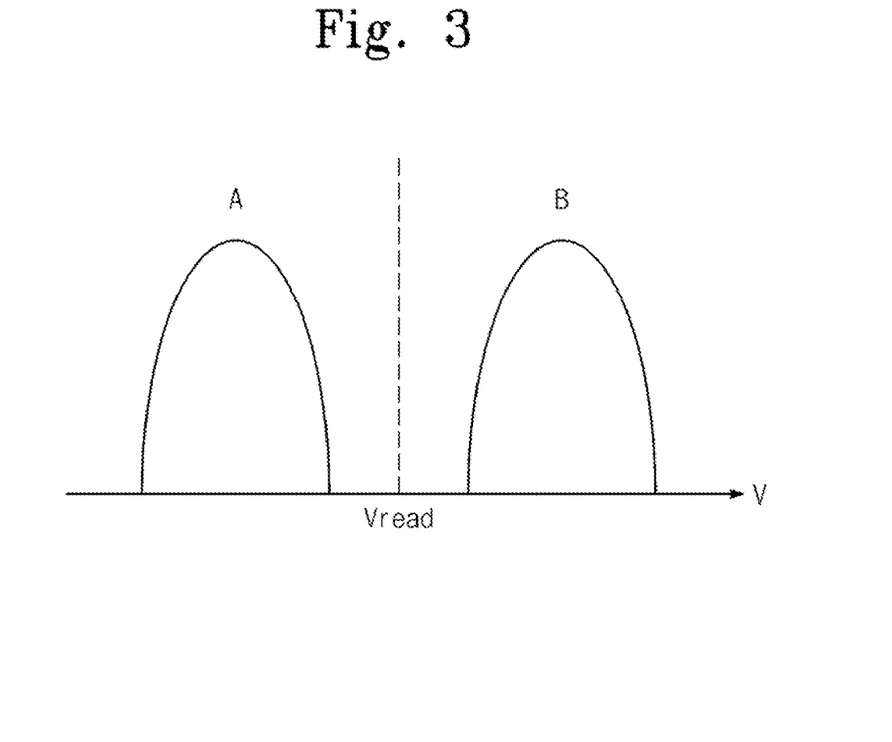
FIG. 3 is a diagram illustrating a distribution of threshold voltages of memory cells when the memory cells of FIG. 2 are normally programmed.

FIG. 3 is a diagram illustrating the distribution of threshold voltages of memory cells when the memory cells of FIG. 2 are normally programmed. In FIG. 3, the horizontal axis represents a voltage and a vertical axis (not shown) would represent the number of memory cells (MC). A read voltage (Vread) represents a voltage applied to a memory cell to discriminate a logic state of the memory cell during a read operation. Referring to FIG. 3, a curve (A) represents memory cells having threshold voltages lower than the read voltage (Vread). That is, the curve (A) represents program-inhibited (unselected) memory cells during a program operation. A curve (B) represents memory cells having threshold voltages higher than the read voltage (Vread). That is, the curve (B) represents programmed memory cells during a program operation. A voltage section between the curve (A) and the curve (B) is used as a read margin.

Figure 4:
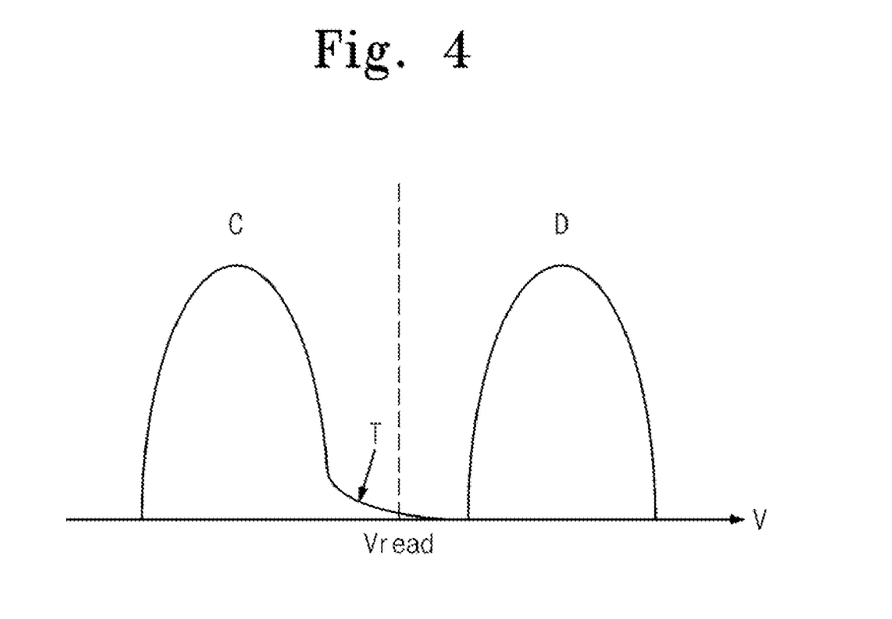
FIG. 4 is a diagram illustrating a distribution of threshold voltages of memory cells when a program disturbance occurs in the memory cells of FIG. 2.

FIG. 4 is a diagram illustrating the distribution of threshold voltages of memory cells when a program disturbance occurs in the memory cells of FIG. 2. In FIG. 4, the horizontal axis represents a voltage and a vertical axis (not shown) would represent the number of memory cells. A read voltage (Vread) represents a voltage applied to a memory cell to discriminate a logic state of a memory cell during a read operation. Referring to FIG. 4, a curve (C) represents memory cells having threshold voltages lower than the read voltage (Vread). That is, the curve (C) represents program-inhibited memory cells during a program operation. A curve (D) represents memory cells having threshold voltages higher than the read voltage (Vread). That is, the curve (D) represents programmed memory cells during a program operation.

Threshold voltages of a portion (T) of the program-inhibited memory cells (C) are higher than threshold voltages of the other portion of the program-inhibited memory cells (C). That is, memory cells corresponding to the reference character (T) are programmed by a program disturbance, such as the unintended programming of unselected memory cells connected to a selected word line, even though they were set to be program-inhibited.

One of the reasons that a program disturbance occurs in the program-inhibited memory cells (C) is a channel coupling. In FIG. 2, assume that a memory cell (MC2) among the memory cells (MC1, MC2, MC3 . . . MCn) is a memory cell to be programmed and the other memory cells (MC1, MC3 . . . MCn) are program-inhibited memory cells. At this time, a bit line (BL2) is set to be a ground voltage (Vss) and the other bit lines (BL1, BL3 . . . BLn) are set to be a supply voltage (Vcc). When a pass voltage (Vpass) is applied to the word lines (WL1, WL2 . . . WLm), channel voltages of memory cells connected to the bit lines (BL1, BL3 . . . BLn) is boosted.

At this time, channel voltages of memory cells connected to the bit line (BL2) maintain a ground voltage (Vss). Thus, channel voltages of memory cells connected to bit lines (BL1, BL3) adjacent to the bit line (BL2) are affected by the channel voltages of memory cells connected to the bit line (BL2). For example, a channel coupling affects the channel voltages of memory cells connected to bit lines (BL1, BL3) adjacent to the bit line (BL2). That is, the channel voltages of memory cells connected to bit lines (BL1, BL3) are not boosted enough to inhibit memory cells (MC1, MC3) from being programmed. A program disturbance occurs in the memory cells (MC1, MC3) to increase threshold voltages of the memory cells (MC1, MC3).

Various phenomena well known in this field such as F-Poly coupling as well as a channel coupling can cause a program disturbance. It will be appreciated by those skilled in the art that the nonvolatile memory device 200 according to an exemplary embodiment of the present invention is not limited to detect a program disturbance merely caused by a channel coupling.

As described above, when a program disturbance occurs, threshold voltages of the program-inhibited memory cells such as the memory cells (T) depicted in FIG. 4 increase. If threshold voltages of the program-inhibited memory cells increase above the read voltage (Vread), the program-inhibited memory cells are recognized as programmed memory cells. Assume that a memory cell of an erasure state is represented as logic "1" and a programmed memory cell is represented as logic "0". If a threshold voltage of a memory cell is increased, a memory cell storing logic "1" is recognized as a memory cell storing logic "0".

To overcome the problems described above, the nonvolatile memory device 200 according to an exemplary embodiment of the present invention counts data to be program-inhibited among data to be written as a first count value, writes data, counts program inhibited data among written data as a second count value and controls the program operation by comparing the first count value with the second count value. The nonvolatile memory device 200 can then detect memory cells recognized as being programmed by a program disturbance.

Figure 5:
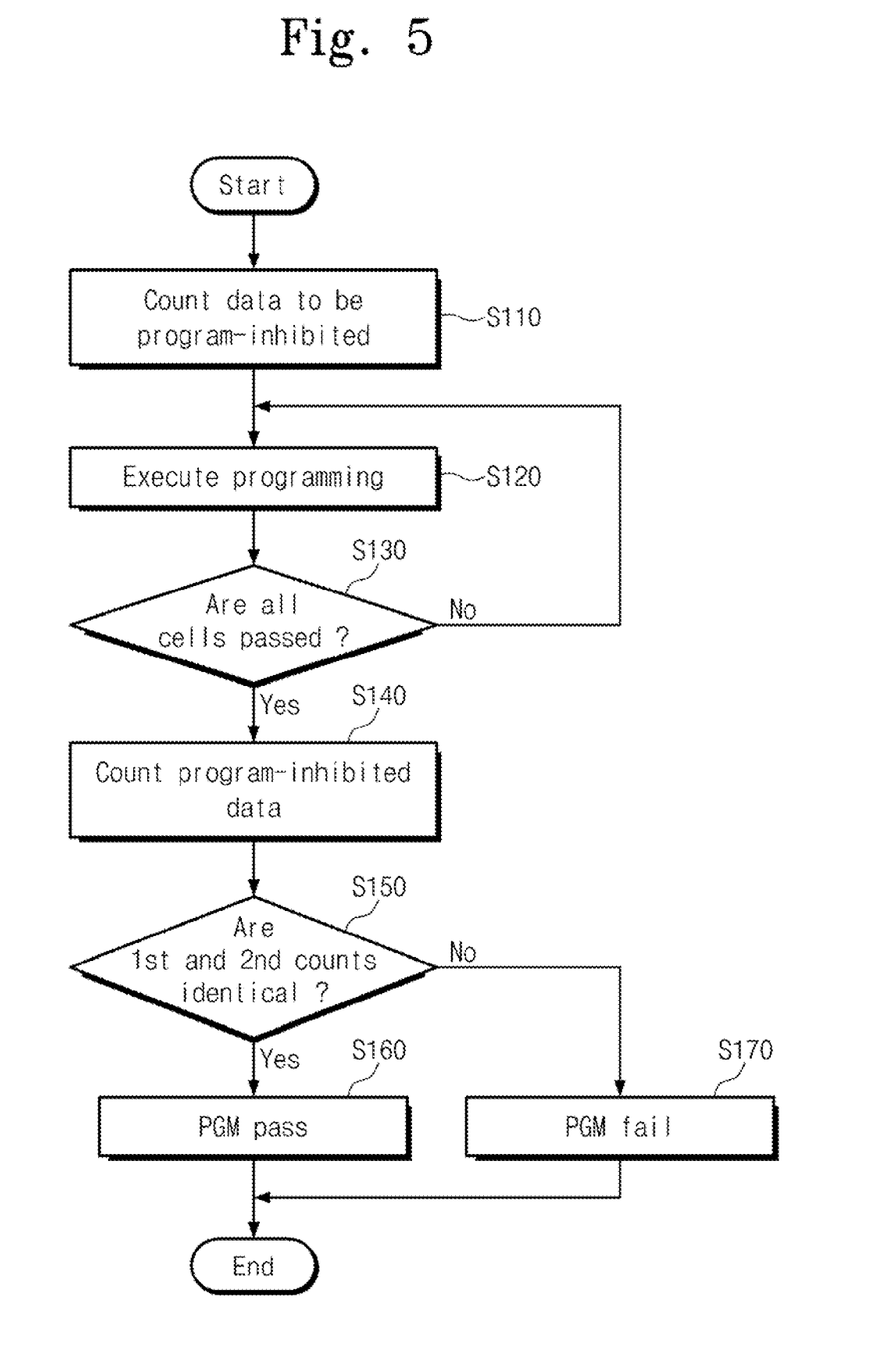
FIG. 5 is a flow chart illustrating an exemplary method of programming the nonvolatile memory device of FIG. 2.

FIG. 5 is a flow chart illustrating an exemplary method of programming the nonvolatile memory device of FIG. 2. Referring to FIGS. 2 and 5, in a S110 step, the count/comparing circuit 250 counts the number of data to be program-inhibited among data to be written. The data I/O circuit 240 receives data (DATA) from the outside. Inputted data (DATA) is transmitted to the read/write circuit 230 through data line (DL). The count/comparing circuit 250 counts the number of data to be program-inhibited (e.g., the value of data is logic "1") among data (DATA) transmitted through the data line (DL). The number of data to be program-inhibited among data to be written is stored as a first count value.

The count/comparing circuit 250 counts the number of data to be program-inhibited among data (DATA) latched onto the data input/out circuit 240. The count/comparing circuit 250 also counts the number of data to be program-inhibited among data (DATA) latched onto the read/write circuit 230.

In the S120 step, a program operation is executed. A ground voltage (Vss) is applied to a bit line to be programmed among the bit lines (BL1, BL2, BL3 . . . BLn) and a supply voltage (Vcc) is applied to the other bit lines. A supply voltage (Vss) is applied to the string selection line (SSL) and a ground voltage (Vss) is applied to the ground selection line (GSL). A program voltage (Vpgm) is applied to a word line to be programmed among the word lines (WL1, WL2 . . . WLm) and a pass voltage (Vpass) is applied to the other word lines.

In the S130 step, a verification operation is executed. During the verification operation, if all memory cells have passed, i.e., the program operation has executed properly, S140 step is executed and if program-failed memory cells exist, the program operation is executed again in the S120 step. At this time, a program voltage (Vpgm) increases by a predetermined value.

In the S140 step, the count/comparing circuit 250 counts the number of program-inhibited data among memory cells into which data (DATA) is written. First, a read operation is applied to memory cells into which data (DATA) is written. The count/comparing circuit 250 counts the number of program-inhibited data among read data latched onto the read/write circuit 230.

In a S150 step, the count/comparing circuit 250 compares the first and second count values. When the first and second count values are identical, memory cells to be written as logic "1" are all written as logic "1" and memory cells to be written as logic "0" are all written as logic "0". That is, memory cells whose written data are changed by a program disturbance don't exist. Accordingly, in a S160 step, the control logic 260 sets a program pass to finish the program operation.

When the first and second count values are different from each other, threshold voltages of a portion of memory cells into which program-inhibited data are written have become increased by a program disturbance. If a threshold voltage of a memory cell which is program-inhibited to store logic "1" is increased above a read voltage by a program disturbance, the memory cell is recognized as storing logic "0" during a read operation. Accordingly, in a S170 step, the control logic 260 sets a program fail to finish the program operation.

However, if the controller 100 of FIG. 1 connected to the nonvolatile memory device 200 has a function that corrects errors using ECC, the S150 step result can have the program fail path changed to a program pass path. For example, if the difference between the first and second count values is within a range capable of being corrected by ECC, the control logic 260 sets a program pass even though the first and second count values are different from each other.

Figure 6:
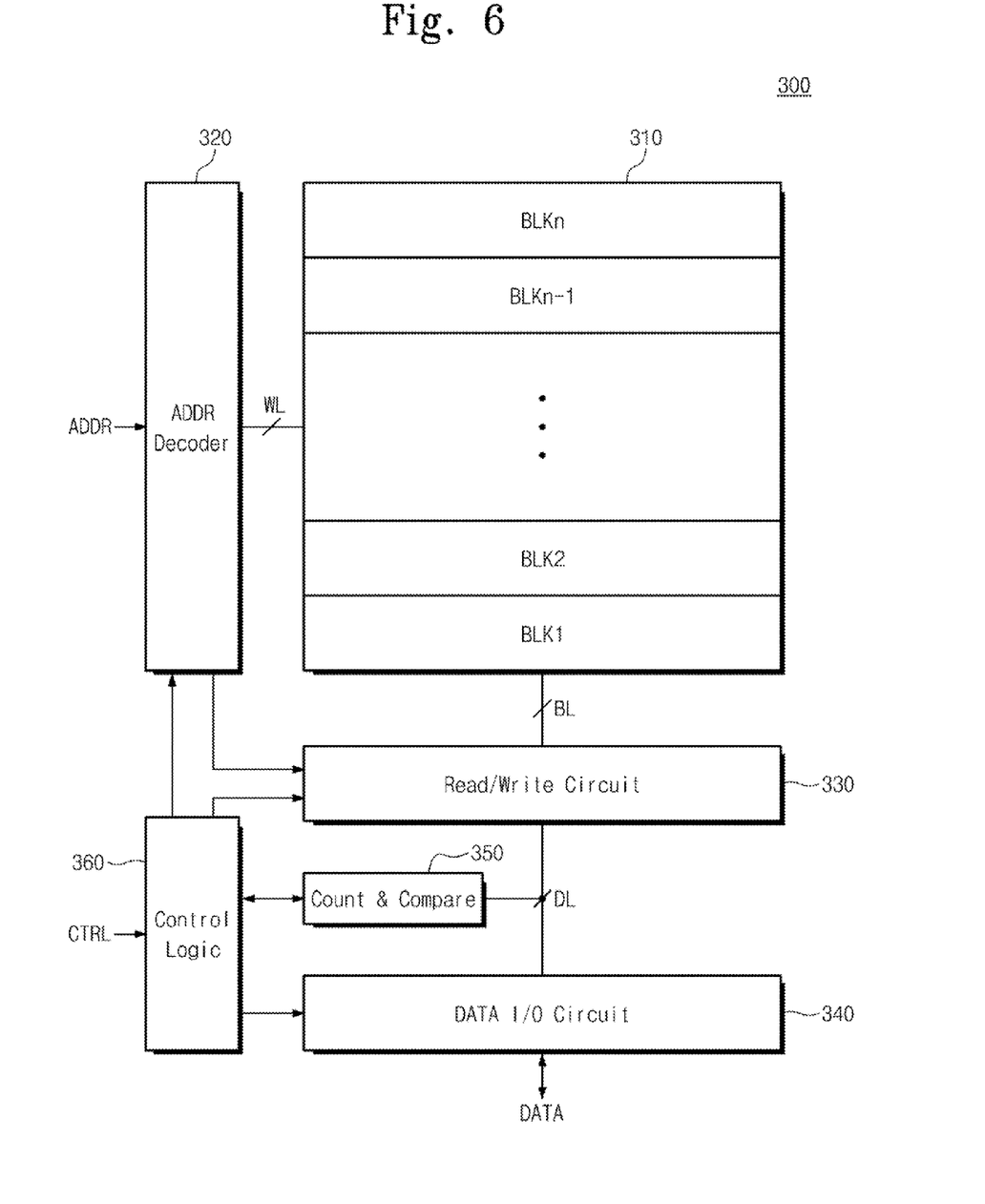
FIG. 6 is a block diagram illustrating an exemplary embodiment of the nonvolatile memory device of FIG. 1.

FIG. 6 is a block diagram illustrating an exemplary embodiment of the nonvolatile memory device of FIG. 1. In FIGS. 2 and 6, like reference numerals refer to similar or the same elements throughout. Referring to FIG. 6, a nonvolatile memory device 300 includes a memory cell array 310, an address decoder 320, a read/write circuit 330, a data I/O circuit 340, a count/comparing circuit 350 and control logic 360. The address decoder 320, the read/write circuit 330, the data I/O circuit 340, the count/comparing circuit 350 and the control logic 360 are the same as the address decoder 220, the read/write circuit 230, the data I/O circuit 240, the count/comparing circuit 250 and the control logic 260 described referring to FIG. 2, respectively. Thus, a further detailed description is not needed.

The memory cell array 310 is connected to the read/write circuit 330 through bit lines (BL) and is connected to the address decoder 320 through word lines (WL). The memory cell array 310 includes a plurality of memory blocks (BLK1, BLK2 . . . BLKn−1, BLKn).

The memory cell array 310 stores at least one bit in one memory cell example, the data stored in one memory cell can be logic "11", logic "10", logic "00" and logic "01". A program to a most significant bit (MSB) and a least significant bit (LSB) is executed to write data in a memory cell. When a program to a most significant bit (MSB) and a least significant bit (LSB) is executed, the program method described and shown in FIG. 5 is applied.

First, a program to a least significant bit (LSB) is executed. Memory cells of an erasure state (i.e., logic "11" state) are programmed to have any one state of logic "11" and logic "10". When a program to a least significant bit (LSB) is executed, memory cells to be programmed to have logic "11" state are memory cells to be program-inhibited. Accordingly, the number of data of logic "11" to be program-inhibited among data of a least significant bit (LSB) to be written are counted as a first count value and the number of data of logic "11" which are program-inhibited among data of a least significant bit (LSB) which were written are counted as a second count value. As described referring to FIG. 5, program disturbed cells are detected by then comparing the first and second count values. Also, even though the first and second count values are different from each other, the control logic 360 sets a program pass if the difference between the first and second count values is within the range capable of being corrected by ECC.

A program to a most significant bit (MSB) is then executed. Memory cells of logic "11" state are programmed to have any one state of logic "11" and logic "01". That is, logic "11" among a most significant bit (MSB) data to be written are data to be program-inhibited. Similarly, memory cells of logic "10" state are programmed to have any one state of logic "10" and logic "00". That is, logic "10" among a most significant bit (MSB) data to be written are data to be program-inhibited. Thus, as described referring to FIG. 5, a program disturbance can be detected by comparing the number of data to be program-inhibited with the number of program-inhibited data.

A program to a most significant bit (MSB) data includes a program to logic "11" and logic "10". The program to logic "11" and logic "10" can be simultaneously or sequentially executed. A program method according to an exemplary embodiment of the present invention can be applied regardless of whether the program to logic "11" and logic "10" is simultaneously or sequentially executed.

In accordance with an exemplary embodiment of the present invention there is provided a counting of program-inhibited data when a program operates, a counting of memory cells which are not programmed among memory cells in which data are programmed and a detecting a program disturbance by comparing the two count values. When the program to logic "11" and logic "10" is sequentially executed, the program method described referring to FIG. 5 is applied. The program method according to an exemplary embodiment of the present invention when the program to logic "11" and logic "10" is simultaneously executed will be described in more detail referring to FIG. 7.

Figure 7:
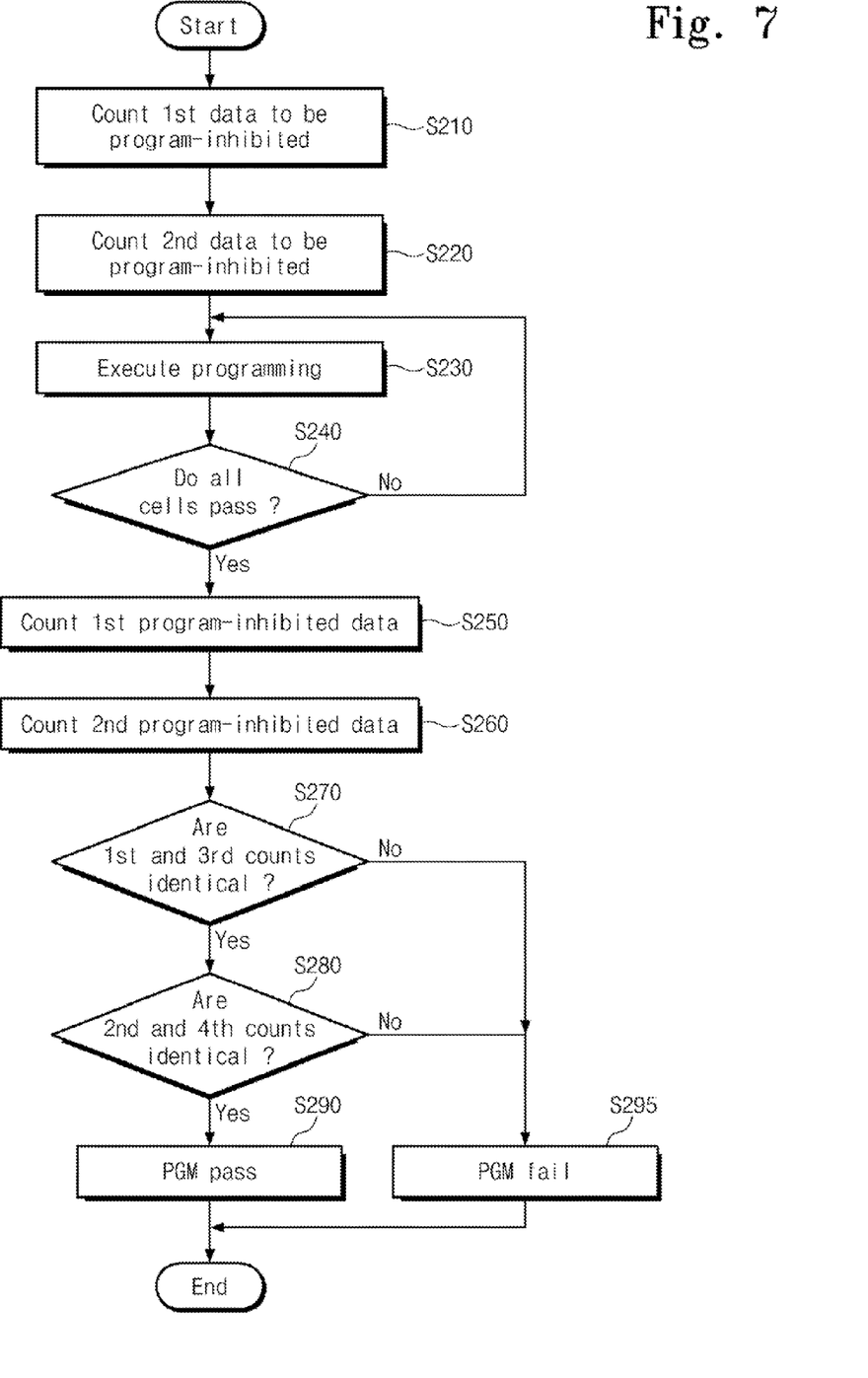
FIG. 7 is a flow chart illustrating an exemplary method of multi-level programming of the nonvolatile memory device of FIG. 6.

FIG. 7 is a flow chart illustrating a multi-level program of the nonvolatile memory device of FIG. 6. More specifically, FIG. 7 is a flow chart for describing a method of programming memory cells having at least three logic states when one program operates. When the program operates, assume that memory cells are programmed as an erasure state (i.e., logic "11"), a first logic state (i.e., logic "10") and a second logic state (i.e., logic "00") having a threshold voltage higher than the first logic state.

In a S210 step, first data to be program-inhibited are counted as a first count value. The first data to be program-inhibited are memory cells to be programmed to maintain an erasure state (i.e., logic "11" state) when the program operates. In other words, the first data to be program-inhibited is memory cells which are set to be program-inhibited from a beginning of a program operation.

In a S220 step, second data to be program-inhibited are counted as a second count value. The second data to be program-inhibited are memory cells to be programmed as a first logic state (i.e., logic "10" state) when a program operates. If memory cells are programmed having at least three logic states during one program operation, the program operation may be simultaneously applied to memory cells to be programmed as first and second logic states. That is, threshold voltages of the memory cells to be programmed as first and second logic states increase together. When threshold voltages of memory cells to be programmed as a first logic state reach a target, the memory cells to be programmed as a first logic state are set to be program-inhibited.

After that, a program operates until threshold voltages of memory cells to be programmed as a second logic state reach a target.

However, since a program operation is continuously applied to memory cells to be programmed as a second logic state after the memory cells programmed as a first logic state are set to be program-inhibited, a program disturbance can occur in the memory cells programmed as a first logic state by the memory cells to be programmed as a second logic state. The second data to be program-inhibited is counted as a second value to detect a program disturbance of program-inhibited memory cells during a program operation. Second program-inhibited cells are memory cells whose threshold voltages increase to be program-inhibited during a program operation.

In a S230 step, a program operation is executed. The program operation is repeatedly executed until all memory cells are program-passed (S240). In the S230 and S240 steps, memory cells of an erasure state (i.e., logic "11" state) are programmed as one of logic "11", logic "10" and logic "00" states. Since memory cells maintaining an erasure state (i.e., logic "11" state) can be affected by memory cells programmed as logic "10" state and memory cells programmed as logic "00" state (for example, a channel coupling may affect the memory cells), a program disturbance can occur in the memory cells maintaining logic "11" state. Since memory cells programmed as logic "10" state can be affected by such as a channel coupling memory cells programmed as logic "00" state, a program disturbance can occur in the memory cells programmed as logic "10" state.

In a S250 step, first program-inhibited data is counted as a third count value. The first program-inhibited data are for memory cells maintaining an erasure state (i.e., logic "1" state). In a S260 step, second program-inhibited data are counted as a fourth count value. The second program-inhibited data are for memory cells maintaining logic "10" state.

In a S270 step, the first count value and the third count value are compared with each other. The first count value is the number of memory cells to be programmed to maintain an erasure state (i.e., logic "11" state) and the third count value is the number of memory cells maintaining an erasure state (i.e., logic "11" state) among memory cells into which data is written. Memory cells whose logic states are changed by a program disturbance among memory cells programmed to maintain an erasure state (i.e., logic "11" state) are detected by comparing the first and third count values. If the first count value is not the same as the third count value, a program fail is set in a S295 step.

If the first count value is the same as the third count value, the second and fourth count values are compared with each other in a S280 step. The second count value is the number of memory cells to be programmed as a first logic state (i.e., logic "10" state) and the fourth count value is the number of memory cells programmed as the first logic state (i.e., logic "10" state) among memory cells into which data is written. Memory cells whose logic states are changed by a program disturbance among memory cells programmed as the first logic state (i.e., logic "10" state) are detected by comparing the second and fourth count values. If the second count value is the same as the fourth count value, a program pass is set in a S290 step. If the second count value is not the same as the fourth count value, a program fail is set in a S295 step.

Similar to that as described referring to FIG. 5, in the S295 step, if the differences between the first and third count values and between the second and fourth count values are within the range capable of being corrected by an ECC, a program pass is set. If the sum of a difference between the first and third count values and a difference between the second and fourth count values is within the range capable of being corrected by an ECC, a program pass is set.

As described above, the program method according to exemplary embodiments of the present invention is applied to memory cells set to be program-inhibited from when a program operation starts and memory cells set to be program-inhibited during a program operation. That is, the program method according to an exemplary embodiment of the present invention can be applied to the case where a program operation is simultaneously applied to logic "10" state and logic "11" state as described referring to FIG. 7.

Referring back to FIG. 6, a portion of the memory blocks (BLK1, BLK2, BLK3 . . . BLKn−1, BLKn) stores one bit in one memory cell and another portion of the memory blocks (BLK2, BLK3 . . . BLKn−1, BLKn) stores a plurality of bits in one memory cell. For example, memory blocks (BLK1, BLK2) may include single level cells (SLC) and memory cells (BLKn−1, BLKn) may include multi level cells (MLC). If a program operation is applied to the memory blocks (BLK1, BLK2) and the memory cells (BLKn−1, BLKn), the program method described referring to FIGS. 5 and 7 would be applied.

The read/write circuit 330 is the same as the read/write circuit 230 described referring to FIG. 2 and a portion of a structure of the read/write circuit 330 would be changed depending on how many bits the memory blocks (BLK1, BLK2 . . . BLKn) store in one memory cell. Since circuits for programming multi level cells (MLC) are well known to those who are skilled in the art, a detailed description is omitted.

As described above, the nonvolatile memory devices 200, 300 detect memory cells in which a program disturbance occurred. Thus, the nonvolatile memory devices 200, 300 can prevent a program error.

Figure 8:
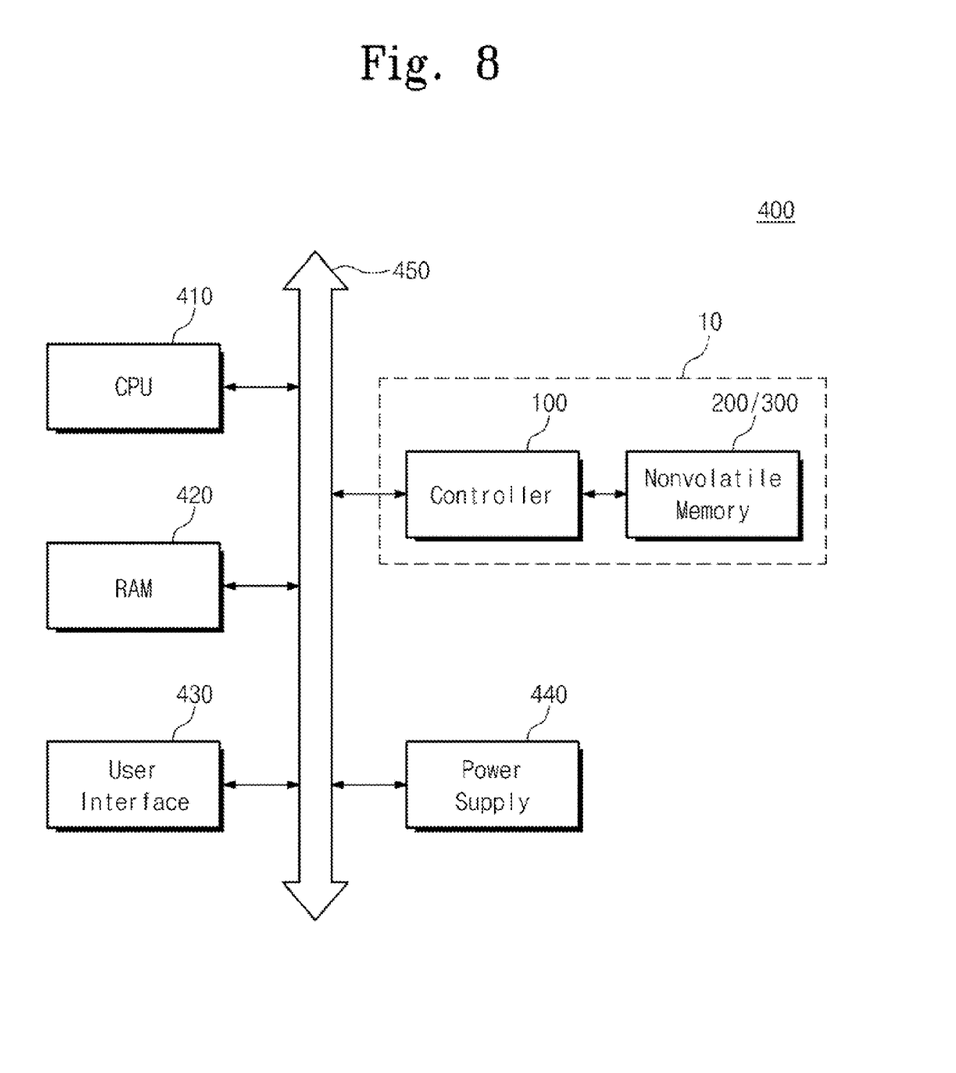
FIG. 8 is a block diagram of an exemplary embodiment of a computing system including the memory system of FIG. 1.

FIG. 8 is a block diagram of an exemplary embodiment of a computing system including the memory system of FIG. 1. Referring to FIG. 8, a computing system 400 according to an exemplary embodiment of the present invention includes a central processing unit (CPU) 410, a RAM 420, a user interface 430 and a memory system 10.

The memory system 10 is connected to the CPU 410, the RAM 420, the user interface 430 and a power supply 440 through a system bus 450. Data provided through the user interface 430 or processed by the CPU 410 is stored in the memory system 10. The memory system 10 includes a controller 100 and a nonvolatile memory device (200/300).

When the memory system 10 is used as a SSD, a booting speed of the computing system 400 can be significantly improved. Even though not depicted in a drawing, the system according to the present invention can further include a camera image processor and an application chipset.

Although exemplary embodiments of the present invention have been described, those skilled in the art will readily appreciate that many modifications are possible to the embodiments. Accordingly, the exemplary embodiments, modifications to the exemplary embodiments, as well as other exemplary embodiments, are intended to be included within the scope of the appended claims.

What is claimed is:

1. A nonvolatile memory device comprising:
a counter that counts an amount of data to be program-inhibited among data to be written to memory cells to provide a first count value and that counts an amount of program-inhibited data among data written to the memory cells to provide a second count value; and
control logic that determines a program pass or a program fail by comparing the first count value with the second count value.

2. The nonvolatile memory device of claim 1,
wherein the control logic sets the program pass that indicates that the data written to the memory cell are programmed properly when the first count value and the second count value are the same.

3. The nonvolatile memory device of claim 1,
wherein the control logic sets the program fail that indicates that the data written to the memory cells are not programmed properly when the first count value and the second count value are different.

4. The nonvolatile memory device of claim 3, wherein the control logic overrides the program fail and sets a program pass that indicates that the data written to the memory cells are programmed properly when a difference between the first count value and the second count value are within a range correctable by an error correction code.

5. The nonvolatile memory device of claim 1, wherein the control logic detects programmed data among the data to be program-inhibited by comparing the first count value with the second count value.

6. The nonvolatile memory device of claim 1, wherein the control logic detects a program disturbance of the memory cells into which the data to be program-inhibited are written by comparing the first count value with the second count value.

7. The nonvoltatile memory device of claim 6, wherein the program disturbance results from channel coupling of channel voltages between adjacent channels.

8. A method of programming a nonvolatile memory device comprising:
counting data to be program-inhibited among data to be written to memory cells to provide a first count value;
writing the data to be written to the memory cells;
counting program-inhibited data among the written data to the memory cells to provide a second count value; and
determining a program pass or a program fail by comparing the first count value and the second count value.

9. The method of claim 8,
wherein if the first count value and the second count value are the same, the data written to the memory cells is deemed to be programmed properly.

10. A memory system comprising:
a nonvolatile memory device having memory cells; and
a controller that controls the nonvolatile memory device,
wherein the nonvolatile memory device comprises:
a counter that counts an amount data to be program-inhibited among data to be written to the memory cells to provide a first count value and that counts an amount of program-inhibited data among data written to the memory cells to provide a second count value; and
control logic that determines a program pass or a program fail by comparing the first count value with the second count value.

11. The memory system of claim 10, wherein the nonvolatile memory device and the controller comprise a solid state drive.

12. The memory system of claim 10, wherein the nonvolatile memory device and the controller comprise a memory card.

13. A method of programming a nonvolatile memory device comprising:
counting first data to be program-inhibited among data to be written to memory cells to provide a first count value;
counting second data to be programmed and then program-inhibited among the data to be written to memory cells to provide a second count value;
writing the data to be written to the memory cells;
counting first program-inhibited data among data written to the memory cells to provide a third count value;
counting second programmed and then program-inhibited data among the written data to the memory cells to provide a fourth count value; and
determining a program pass or a program fail by comparing the first count value with the third count value and comparing the second count value with the fourth count value.

14. The method of claim 13, wherein if the first count value when compared with the third count value are the same and if the second count value when compared with the fourth count value are the same, the first and second data written to the memory cells is deemed to be programmed properly.

15. The method of claim 13, wherein if the first count value when compared with the third count value are different, or if the second count value when compared with the fourth count value are different, the first and second data written to the memory cells is deemed to be not programmed properly.

16. The method of claim 13, wherein the nonvolatile memory device comprises memory cells having at least three logic states that include an erasure logic state corresponding to the first data, a first programmed state having a first threshold voltage corresponding to the second data and a second programmed state having a second threshold voltage higher than the first threshold voltage.

* * * * *